United States Patent [19]

Brandelik et al.

[11] Patent Number: 5,287,302
[45] Date of Patent: Feb. 15, 1994

[54] SUPERCONDUCTING OPTICALLY RECONFIGURABLE MAGNETIC DEVICE

[75] Inventors: Joseph E. Brandelik, New Carlisle, Ohio; Andrew H. Suzuki, Kihei, Hi.

[73] Assignee: The United States of America as represented by the Secretary of the Air Force, Washington, D.C.

[21] Appl. No.: 902,257

[22] Filed: Jun. 22, 1992

[51] Int. Cl.$^5$ .................. H03K 17/92; H01L 39/00; G11B 11/10
[52] U.S. Cl. .................. 365/161; 505/701; 505/1; 257/33
[58] Field of Search .................. 365/161; 505/701; 428/688; 257/33

[56] References Cited

U.S. PATENT DOCUMENTS

| | | | |
|---|---|---|---|
| 3,641,517 | 2/1972 | Brilman et al. | 365/160 |
| 4,336,523 | 6/1982 | Jaggi | 365/160 |
| 4,586,062 | 4/1986 | Bouffard et al. | 357/5 |
| 4,891,355 | 1/1990 | Hayashi et al. | 505/1 |
| 4,904,882 | 2/1990 | Szu | 307/245 |
| 4,916,115 | 4/1990 | Mantese et al. | 505/1 |

OTHER PUBLICATIONS

Demetri Psaltis et al., Title, Optical Image Correlation with a Binary Spatial Light Modulator, vol. 23, No. 6, Nov.-Dec. 1984, pp. 698-704 (Optical Engineering).
W. E. Ross et al., Title, Optical Engineering, Two-Dimensional Magnetooptic Spatial Light Modulator for Signal Processing, vol. 22, No. 4, pp. 485-490, Jul.-Aug. 1983.
W. E. Ross et al., Title SPIE, Advances in Optical Information Processing, vol. 388, 1983, pp. 55-64.
Semetex Corp., Sight-Mod.
G. T. Roome, et al., Title IEEE Transactions on Microwave Theory and Techniques, Section II, MIC Components, Jul. 1968, pp. 411-420.
G. T. Roome et al., Title Journal of Applied Physics, Thin Ferrite Phase Shifters for Integrated Microwave Devices, vol. 38, No. 3, Mar. 1967, Section II, pp. 1411-1412.
C. E. Fay & R. L. Comstock, Title IEEE Transactions, Operation of the Ferrite Junction Circulator, Section II Microwave Integrated Circuits, pp. 1-13.
C. K. Greene, Title IEEE Transaction on Microwave Theory and Techniques, A Microstrip Nonreciprocal Tunable Yig Filter, Section II, Jul. 1968, pp. 485-486.

*Primary Examiner*—Eugene R. LaRoche
*Assistant Examiner*—Viet Q. Nguyen
*Attorney, Agent, or Firm*—Gerald B. Hollins; Thomas L. Kundert

[57] ABSTRACT

A superconducting optically reconfigurable device (SORD) wherein predetermined and optically achieved patterns of superconducting material generate Meissner effect magnetic flux to achieve control of physical characteristics in local areas of an adjacent film of electromagnetic energy controlling material. The superconducting material magnetic flux is remembered by way of a cycle wherein selected portions of the material are elevated from the superconducting temperature range through the critical temperature $T_c$ into the non-superconducting state while in the presence of a writing magnetic field and then cooled through the critical temperature $T_c$ to permanently retain the writing magnetic flux in the area of temporary optical warming. The pattern of magnetic flux thusly achieved is coupled to one of several possible electromagnetic energy influencing or controlling materials which also have magnetic flux susceptibility. The magnetically influenced areas of the electromagnetic energy affecting or controlling material can accomplish a variety of controlling operations on the receive electromagnetic energy, these effects including Faraday effect alteration of phase relationships in a left and right circularly polarized spatial light modulator. The magnetic flux affected material may also be a ferrite wherein the Faraday effect steering of radio frequency spectrum energy between ports of a circulator, for example, can be accomplished.

19 Claims, 3 Drawing Sheets

SUPERCONDUCTING OPTICALLY RECONFIGURABLE MAGNETIC DEVICE

RIGHTS OF THE GOVERNMENT

The invention described herein may be manufactured and used by or for the Government of the United States for all governmental purposes without the payment of any royalty.

CROSS REFERENCE TO RELATED APPLICATION

The present patent document is somewhat related to the concurrently filed and commonly assigned patent document "Superconducting Optically Reconfigurable Electrical Device", Ser. No. 902,256, which originates with the same inventors and is hereby incorporated by reference herein.

BACKGROUND OF THE INVENTION

The invention relates to the field of superconducting materials and to thin film geometries of these materials which are pattern alterable through use of controlling optical energy.

The superconducting optically reconfigurable device (SORD), of the present invention, integrates physical processes underlying the electrical superconductivity phenomenon and its magnetic manifestation with the field of optics. The SORD uses the ability of a superconductor to transition from the superconducting to a less conductive state and related magnetic properties changes as its defining mechanism. This transition from the superconducting state to the normal state is dependent upon the breaking up of so-called Cooper pair electrons; one means of accomplishing this breaking up is by the injection of what are termed quasiparticles. Quasiparticle injection can, in fact, be accomplished by various means, however, for present purposes the means of most interest is by optical illumination. For these purposes, similar behavior between high and low temperature superconductors is presumed.

The patent art indicates the presence of considerable activity in the superconducting and other SORD related arts. Included in this activity is the patent of J. H. Boufford et al, U.S. Pat. No. 4,586,062, which teaches the achievement of microcircuits formed of superconducting material, material which when exposed to cryogenic temperatures, provides superconducting regions.

Additionally included in the art is the patent to N. Hayashi et al, U.S. Pat. No. 4,891,355, describing a method for producing a superconducting device by applying a laser beam to a part of the superconducting phase to cause transition from a superconducting to a non-superconducting phase.

Also included is the patent to H. H. Szu, U.S. Pat. No. 4,904,882, describing a superconducting optical switch which is controlled by radiation from a spatial light modulator.

Additionally included in this art is the patent to J. V. Mantese et al, U.S. Pat. No. 4,916,115, teaching the formation of a superconductive device of metalloorganic film which absorbs selective laser light wavelengths.

None of these prior patents, however, teaches the achievement of a reconfigurable superconductive magnetic device as is accomplished in the present invention.

SUMMARY OF THE INVENTION

The present Superconducting Optically Reconfigurable Device (SORD) comprises an application of the superconductive phenomenon to the achievement of magnetic correlation devices. The accomplished correlation devices are controllable by optical illumination. The SORD concept is based on quasiparticle injection into superconducting thin films to produce a detectable physical properties response. Quasiparticle injection can be accomplished via different means including the herein preferred selective optical illumination. The present SORD utilizes this optical illumination to produce a phase change and a resulting electromagnetic energy communicating change in a material controlled by the superconductor material.

Since the SORD uses optical illumination, the device response can be reconfigured by altering one or more characteristics of the input illumination. This alteration can in fact be accomplished by changing the illumination's intensity, spatial orientation, wavelength, or combinations of these factors. The present SORD can also be realized by using either high or low temperature superconducting materials. A restriction placed on the SORD device is, however, that the host film thickness be less than the film material's absorption depth. The SORD lends to circuit applications in the areas of detector array processing, wideband communications, pulse compression radar, magnetic memory, optical signal processing and signal spectrum analysis, for example.

It is therefore an object of the present invention to achieve an optically configurable thin film structure.

It is another object of the invention to achieve an optically configurable superconducting device.

It is another object of the invention to provide a superconducting device in which quasiparticles generated by optical energy define the architecture of the device.

It is another object of the invention to provide a superconducting device which is compatible with both low and high temperature superconducting materials.

It is another object of the invention to provide a superconductor apparatus in which illumination intensity, illumination spatial orientation, illumination wavelength or combinations of these optical factors may be used to control the device characteristics.

It is another object of the invention to provide an optically controllable magnetic memory device.

It is another object of the invention to combine the Meissner effect properties of a superconductive material with the magnetic response properties of a physically adjacent material.

It is another object of the invention to control a selected form of energy flow through the use of an optical to Meissner effect to magnetically susceptible properties coupling sequence.

It is another object of the invention to use this coupling sequence to control a flow of radio frequency energy.

It is another object of the invention to use this coupling sequence to control a flow of polarized optical energy.

It is another object of the invention to use this coupling sequence to modulate a flow of optical energy.

Additional objects and features of the invention will be understood from the following description and claims and the accompanying drawings.

These and other objects of the invention are achieved by Optically controllable superconductor signal processing apparatus comprising the combination of; superconductor memory means including a superconductor material first film layer having selectable pattern area magnetic flux present and magnetic flux absent Meissner effect related superconducting memory capability; a layer of magnetic flux controllable second material disposed adjacent said superconductor material first film layer, said second layer material having predetermined electromagnetic energy signal flow influencing characteristics susceptible of magnetic flux presence and absence control by magnetic flux from said adjacent first film layer superconductor material; superconductor film memory writing means including means for disposing a magnetic field in predetermined writing orientation with respect to said superconductor material first film layer; and optical energy generating means for disposing a said pattern area related plan of temperature increasing optical energy onto a superconducting temperatured surface of said first layer superconductor material, during exposure to said magnetic field, for generating superconductivity-remembered flux-present of said pattern areas in optically warmed and subsequently recooled portions of said superconductor material and superconductivity-remembered flux-absent of said pattern areas in non optically warmed portions of said superconductor material.

DETAILED DESCRIPTION

Two physical states of existence for a conductive or semiconductive material are generally recognized; the warm temperature or normal state and the superconducting state which usually involves colder temperatures. A useful characteristic of the superconducting state is the great decrease in electrical resistance which occurs in a material during superconductivity. Another interesting characteristic of the superconducting state is called by the name of the Meissner effect and is typified by an exclusion of magnetic fields from the interior of a superconductor material mass. Each of such changes in physical properties can be employed in useful SORD arrangements as is explained below herein and in the above identified commonly filed and incorporated herein by reference companion patent application. In actuality, the present of these two applications is principally concerned with the latter magnetically responsive arrangement of a SORD, while the companion application is principally concerned with the electrical effect properties of a SORD.

Figure 1:
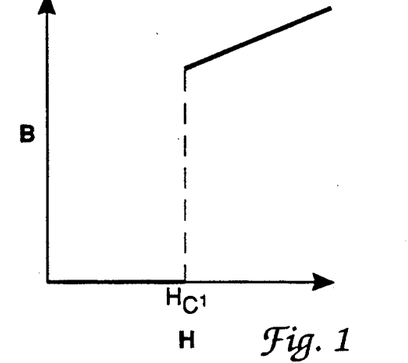
FIG. 1 shows the relationship between magnetic field strength and flux density for a type I superconductor.
Figure 2:
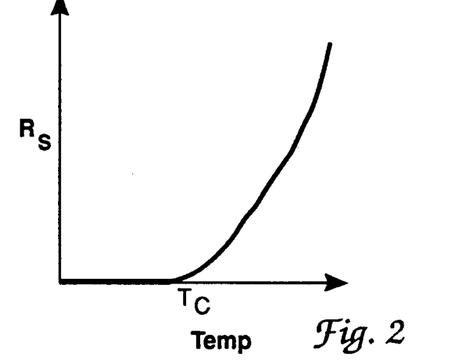
FIG. 2 shows the relationship between temperature and electrical resistance for a type I superconductor.

In addition to the Meissner effect or magnetic properties related uses of superconductivity, there are two varieties of superconductors which are of concern in the present invention; these are the so termed Type I and Type II varieties. Phase transition characteristics between normal and superconducting states define the difference between these two varieties of material as is shown in FIGS. 1-4 of the drawings. These figures present graphical representations of the magnetic or B-H and the electrical resistance temperature response characteristics of the two types of superconductors. FIGS. 1 & 2 of this group represent Type I superconductors and FIGS. 3 and 4 Type II superconductors. In addition to the following discussion of the Type I and Type II superconducting materials an introductory description of superconductivity and the Type I and Type II materials is to be found in an article titled "Superconductivity", written by D. N. Langenberg and appearing in the McGraw-Hill Encyclopedia of Science and Technology, Volume 17 of the 1987 copyright version, page 609. The Langenberg article and the references identified therein are also hereby incorporated by reference herein.

Figure 3:
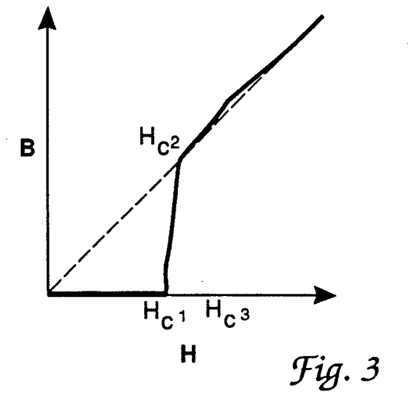
FIG. 3 shows the relationship between magnetic field strength and flux density for a type II superconductor.
Figure 4:
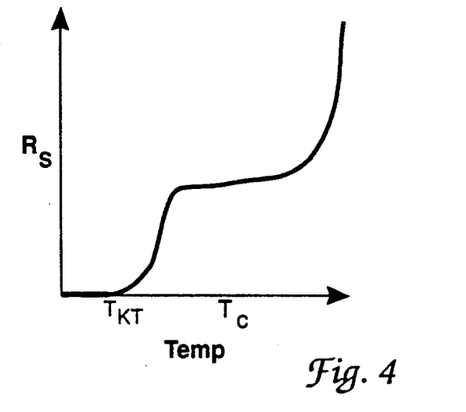
FIG. 4 shows the relationship between temperature and electrical resistance for a type II superconductor.

The driving mechanism behind the FIGS. 1-4 phase transitions are magnetic field strength in FIGS. 1 and 3 and ambient temperature in FIGS. 2 and 4. The major difference between the two types of superconductors lies in their normal phase to superconducting phase transitions. As a Type I superconductor transitions from the normal to the superconducting state, any magnetic field entering the material will be locked in during the phase transition. A similar, but distinguishable, effect occurs for the Type II superconductor, where the material is characterized by the occurrence of only a partial flux penetration into the body of a material mass. The Type II superconductor therefore makes an interim phase transition to a partial "Meissner" condition prior to phase transitioning into either the normal or the superconducting state. The Meissner effect, as is particularly of interest in the present invention, has been defined as the expulsion of magnetic flux from the interior of a superconducting material when it is cooled in a magnetic field to below the critical temperature, near absolute zero, at which the transition to superconductivity takes place. See the article titled "Meissner effect" written by Hans W. Meissner and describing the 1933 work of Walter Meissner and R. Ochsenfeld appearing in the McGraw Hill Encyclopedia of Science and Technology, at Volume 10 page 578 which is also hereby incorporated by reference herein.

In "Hard" Type II superconductors the extent of the Meissner effect transition region is minimized by the use of flux pinning mechanisms which tend to situate the flux vortices and reduce the kinetic generation of electrical resistance. It is these phase transitions and the physical mechanisms behind them that the herein described SORD utilizes for its operation.

Thin film superconductors undergo several different processes when illuminated with light. Two of these processes are frequently identified as the slow and fast responses of the material, and represent phase transitions from the superconducting to the normal state. Thin films are subjected to these types of responses because interactions only occur within the absorption depth of the thin film. The absorption depth is the inverse of the absorptivity and is actually determined by the material, the fabrication process, and the light wavelength, involved. For Yttrium Barium Copper Oxides (YBCO), the absorption depth has been quantized to be on the order of 120 nm[1]. (The reference number 1 here relates to the similarly numbered item in the list of references appearing at the conclusion of this specification.) For Niobium and Niobium Nitride, the absorption depths are approximately 300 and 500 angstroms, respectively.

If the superconductor material film thickness being considered in an electrical resistance superconductor application is larger than the absorption depth, a diffusive response produces a simple redirection of current which essentially shorts out or attenuates the quasiparticle injection process. The diffusive process is defined in equation 1 below and is a process which occurs in the order of femtoseconds (i.e., $10^{-15}$ seconds) of time.

Unlike the thermal phase transition process, the Magnetic properties are not significantly altered with quasiparticle variation.

$$D_{em} = p/\mu_o \tag{1}$$

where $p$ = normal resistivity of the material, and $\mu_o$ is the permeability of free space.

Also, for thick films, where the film thickness is larger than the absorption depth, the diffusive process negates the generation of quasiparticles and the phase transitioning response is not observed.

In the quantization of these responses, it was once thought that there was a single response with a very fast nanosecond rise time together with a much slower decay time—a time measurable in microseconds. Recent work has, however, led to the hypothesis that there are two distinct response processes, one fast and one slow, occurring. The distinction between these responses is found by looking at the temporal response characteristics and the temperature regimes.

The fast response has been quantized to be nanosecond or possibly picosecond characterized, whereas the slow response is in the microsecond regime. The slow response is predominant near the critical temperature ($T_c$) of the material and there is no evidence of the slow response occurring at temperatures well below the $T_c$ value. The fast response is evident at temperatures well below $T_c$ as well as at temperatures near $T_c$. There also appears to be saturation of the maximum fast response well below the $T_c$ temperature with saturation disappearing in the region of the slow response. There is also evidence of a slight overlap of these two responses, a fact which may have led to confusion between the nature of the responses. The relative peak of the fast response is thought to be at zero degrees Kelvin whereas the maximum of the slow response occurs at $T_c$.

The mechanism behind the fast response has not been well defined, but is believed to be a nonequilibrium rather than a bolometric (thermal heating based) process. It has also been suggested that the response is based on the hot-electron transport phenomena previously demonstrated in optically excited metals such as copper and gold. It is also hypothesized that incident radiation creates a large number of highly excited electrons and holes in the top 100 nanometers or so of the superconductive film. These so-called hot electrons move through the film either by ballistic or diffusive means after creation. In turn, the hot electrons thermalize with the lattice structure of the material via electron-photon interactions to create the quasiparticles. The observed relaxation time is on the order of picoseconds. The fast response has also been quantized to have a temporal response function which is on the order of tens of nanoseconds. It is quite possible that the actual temporal response of the fast response could be markedly faster, since the speed of measuring equipment and the excitation media may be measurement limiting factors.

The slow response has been extensively studied and is thought to be a predominantly thermal based mechanism. Thermal diffusion and local heating due to incident illumination have been theorized to be the main drivers behind the slow response. The region where the slow response is most dominant is very close to the $T_c$ of the materials.

A superconducting bridge composed of Yttrium Barium Copper Oxide (YBCO) on a Magnesium Oxide (MgO) substrate can be used to characterize fast and slow response temporal characteristics. The thusly observed fast and slow responses have been experimentally verified to have a temporal characteristic in the nanosecond and microsecond regimes respectively.

The present SORD concept is applicable to either low or high temperature superconductive material. If the SORD is fabricated using a high temperature superconductor, then by operating near $T_c$ the cooling requirements are reduced so that liquid nitrogen can be used in lieu of liquid helium. Liquid nitrogen affords a drastic reduction in system cost coupled with an increase in system safety. Superconductor transition temperature ranges have been found to be in the 70°–120° K. range for high temperature materials and in the 1°–15° K. range for low temperature Niobium based materials. These ranges are highly dependent upon fabrication processes as they intimately depend upon carrier density values.

Although films of this type have been manufactured, the process required is intricate since the granularity of the film and its orientation must also be controlled by the process in order to increase the achievable film current density. By using a consistent grain structure and orientation, it is possible to increase the magnitude of the fast and slow response. By using a highly oriented consistent grain structure, the transition region from superconducting to normal may also be reduced; this ultimately means a much quicker device response.

The SORD concept is also extendable to utilize the fast response—a concept which markedly reduces the system reconfiguration time achievable. By using the slow response the system response time may in fact be limited by the substrate material's thermal diffusion characteristics. By using the fast response, the system reconfiguration time also tends to be limited by the time required for reconfiguration of the optics. With the development of better quality higher critical temperature superconductors, it is expected that the fast response will be extended to the temperature region where liquid nitrogen cooling can be used.

A superconducting thin film exhibits a thermal transition due to incident illumination which can be characterized using a heat transfer model as shown in Equation 2.

$$T = 1.18 F(\tau/(Kcp))^{\frac{1}{2}} \tag{2}$$

the variables are defined as:

T=Change in temperature
$\tau$=Duration of optical pulse
F=Rate of heat supplied
K=Substrate thermal conductivity
c=Substrate specific heat
p=Substrate density A YBCO superconductor thin film of 400 angstroms thickness disposition on a MgO substrate will undergo a temperature change of 0.15 to 0.5 degree K with incident illumination. This value correlates well with a predicted value of 0.2 degree K using the equation (2) model. These results use illumination from a 1.06 μm Nd-YAG laser having a short Gaussian shaped 200 ns q-switched laser pulse and an energy of 16 nJ. The superconducting device bias currents may be varied between 1 and 5 mA with measurements occurring between temperatures of 35 and 90 degrees K. A 150 ps pulse with an energy of 150 nJ on a similar superconductor device at 38K with a bias current of 0.5 mA. provides a rise in film temperature of 1.7 degrees K.

It is the underlying concept of the SORD to utilize such changes in film temperature to transition the illuminated region of the device from the superconductive to the resistive or non superconducting operating region. By selectively masking and illuminating parts of a superconducting magnetic device a variety of characteristics may be realized. According to this operation the uncoated or unmasked regions of the device will be free to absorb the incident illumination and undergo a rise in operating temperature—a rise ending with temperatures outside of the superconducting range, and thereby effectively "turn off" portions of the superconductive material magnetic shielding effect.

When the SORD is operating in the temperature regime near $T_c$, the reconfiguration time limit is thought to reside in the substrate's thermal diffusion time. The substrate material can, however, be chosen to reduce reconfiguration time without adversely affecting the device performance. Tradeoff consideration involving microwave or RF response characteristics and thermal, chemical, and lattice matching effects of the substrate are to be considered in the choice of substrate and superconducting materials.

The presently described invention makes practical use of the Meissner effect in a superconducting material. In superconducting demonstrations of this effect, a mass of superconducting material is frequently shown to be levitating or suspended in a motionless condition above a source of magnetic field. This levitation is of course a result of the superconducting material's ability to exclude magnetic flux from its interior region as was discovered in the above recited work of Meissner and Ochsenfeld. In the present invention the response of superconducting material to temperatures just above and just below the critical temperature, $T_c$, is combined with this often-demonstrated levitation or magnetic field exclusion characteristic of the superconducting material to achieve useful results.

More precisely, the present invention involves the exposure of superconducting material to magnetic flux while the material is held just above the critical temperature $T_c$ or while the material is transitioning from just above to just below the $T_c$ temperature in order that the material continue a generation of magnetic flux when cooled to a temperature below $T_c$.

In the interest of clarity in the following description, an attempt is made to distinguish between a mass of material having the capability of being in the superconducting state (depending upon its temperature), and a region within this material which is actually in the superconducting state at the time of consideration. In the following discussion therefore, the former situation, a material capable of being in or out of the superconducting condition is referred to as "a superconductor" and the latter, a region actually in the superconducting condition is referred to "superconducting material" or "a superconducting region". To the best degree possible, this language convention is adopted throughout the present document.

According to further aspects of the present invention, Meissner effect retained magnetic flux may be present and absent in a predetermined pattern across the face of a superconducting material wafer according to a plan that is accomplished under the control of optical energy during the presence, or absence of a magnetic field as the material transitions through $T_c$. This pattern determines the precise areas of flux presence and flux absence to be achieved in the superconducting material during a writing process. Once achieved in the superconducting material, this pattern of flux present and flux absent areas or superconducting and non-superconducting regions is retainable permanently so long as the "below $T_c$"superconducting temperature is maintained in the mass of material.

The present invention therefore contemplates the writing of flux retention areas into a superconducting material mass by transitioning the flux retention areas from above to below the $T_c$ temperature in the presence of a writing magnetic field.

During this writing operation, the flux absent regions of the pattern could of course be exposed to an absence of magnetic field while transitioned above and below $T_c$, however, the most convenient arrangement is to expose the entire mass of superconducting material to the required intensity of magnetic field and use a sharply definable pattern of optical energy to raise only the desired areas of the superconductor material above the $T_c$ temperature. In this arrangement, the unexposed areas remain below the $T_c$ temperature and are thereby unaffected by the writing magnetic field.

According to a further aspect of the present invention, the pattern of flux present and flux absent regions achieved by this above and below $T_c$ manipulation of the superconductor material is employed for useful purposes by the addition of a second closely adjacent layer of material that is responsive to the established pattern of magnetic flux present and flux absent areas in the superconductor material.

A wide variety of magnetic flux responsive materials are, of course, known in the technical art and may be employed in achieving this second layer, however, for the purposes of the present invention, it is desired that this second layer material be of a nature which has the ability to influence a transmitted flow of electromagnetic energy. Even within this further limitation there exists a wide variety of magnetically responsive materials. Two examples of such materials are to be found in the family of garnets having magnetically controllable Faraday effect characteristics that may be used to change the polarization state of electromagnetic energy falling within the optical portion of the energy spectrum and the ferrite materials which have magnetic flux responsive dielectric characteristics that may be exploited with radio frequency energy in the microwave or millimeter wave frequency range. The former optical energy influencing garnet materials are exemplified by yttrium-iron-garnet and the latter radio frequency energy influencing ferrite material is exemplified by nickel-zinc ferrite. Clearly other materials having properties that are useful in controlling energy from the same or other parts of the electromagnetic spectrum are within the scope of the invention.

According to the herein-described arrangements of the invention, it is desired to control a flow of electromagnetic energy by way of a selected pattern of physically altered regions in a material placed in the flow path of the electromagnetic energy. The nature and extent of the employed physical alterations is controlled by precise patterns of magnetic flux achieved with corresponding patterns established in an adjoining superconductor material during optically controlled excursions of the pattern areas above and below the Meissner effect critical temperature $T_c$ of the superconductor material.

Figure 7:
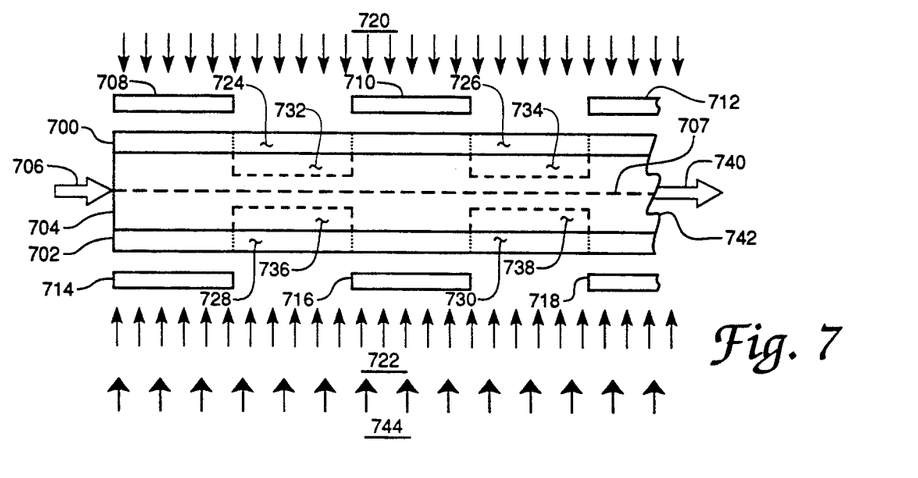
FIG. 7 shows the superconducting control principles of the present invention in an electrical energy apparatus.

FIG. 7 in the drawings shows an application of these concepts to an apparatus for processing electromagnetic energy residing in the microwave or millimeter wave portion of the electromagnetic spectrum. The FIG. 7 apparatus includes both the elements needed to perform this radio frequency energy processing and elements involved in disposing the selected pattern into the superconductor material. The FIG. 7 apparatus includes two layers of superconductor material which are shown at 700 and 702 and which are disposed on opposed faces of a magnetically responsive material 704 such as a ferrite that provides Faraday effect response to a varied magnetic field.

Radio frequency energy received into the FIG. 7 apparatus is indicated by the arrow at 706 and emerges as indicated by the arrow 740. Between the energy input arrow 706 and the output arrow 740 the radio frequency energy travels along the path 707 in traversing the Faraday effect material 704. While traveling along this path 707, the radio frequency energy is susceptible to a possible variety of different effects which may be generically described as flow influences. These influences arise from a plurality of possible physical alterations in regions 732, 734, 736 and 738 of the material 704 in the FIG. 7 apparatus. These regions may be considered to be physically changed in the sense that a property such as the dielectric constant of the ferrite material is altered from that of the surrounding ferrite material by the presence of magnetic flux received from corresponding areas of the superconductor material, areas which are indicated by the numbers 724, 726, 728 and 730 in the FIG. 7 apparatus.

The FIG. 7 apparatus discloses one meaning of the generic term "influencing" with respect to the present invention. This representation is in the sense that the physically altered regions 732, 734, 736 and 738 have the electrical effect of changing such properties as series inductance, shunt capacitance, series and shunt resistance and indeed even the path length between arrows 706 and 740. These regions may thereby act as elements of a delay line or a wave filter apparatus with respect to the radio frequency signal on the path 707. By way of the electrical property alterations occurring in the regions 732, 734, 736 and 738 any of the basic electrical elements of capacitance, resistance, and inductance can be provided along the path 707 in quantities which are useful at some range of radio frequencies, the microwave and millimeter wave portions of the frequency spectrum being especially appropriate for the presently described apparatus.

As indicated in the above discussion, the magnetic flux originating in the areas 724, 726, 728, and 730 stems from the ability of the superconductor material 700 and 702 to remember a magnetic field that was incurred while the superconductor material was transitioning from above to below the critical temperature $T_c$.

The FIG. 7 apparatus also includes a number of heretofore undescribed elements which are not involved in the radio frequency energy flow indicated by the arrows 706 and 740, but which are used in forming the magnetic flux originating areas 724, 726, 728 and 730 in the superconductor materials 700 and 702. These other elements include the magnetic field used for writing the superconducting areas 724, 726, 728, and 730 as is represented at 744 and the optical energy flux fields 720 and 722 used to elevate the superconductor material areas 724, 726, 728 and 730 above the Meissner effect critical temperature $T_c$.

These other elements also include the optical flux shielding regions of pattern masks which are indicated at 708, 710, 712, 714, 716 and 718 in FIG. 7. The utilization of these other elements including the magnetic flux 744, the optical flux 720 and 722, and the mask elements 708–718 is intended during preliminary steps—before application of the radio frequency energy represented by the arrow 706. Actually, this preliminary event sequence may be accomplished as part of the manufacturing or fabricating sequence for the FIG. 7 apparatus and accomplished either in the presence of the magnetically susceptible material 704 as is suggested in FIG. 7 or may be accomplished with the superconductor materials 700 and 702 isolated from the magnetically susceptible material 704.

The FIG. 7 drawing shows a two-dimensional representation of a three-dimensional apparatus. That is, the structure represented in the FIG. 7 drawing may be considered to extend not only additionally to the right of FIG. 7, as is indicated by the broken line 742 but also to extend orthogonally in the directions of into and out of the page of the FIG. 7 drawing; the extent of these extensions as well as dimensions for the apparatus shown in FIG. 7 depend upon the radio frequencies selected for transmission by the FIG. 7 apparatus, the type of use of the apparatus represented, and other considerations. For use in the microwave or millimeter wave frequency bands, and with a material such as nickel-zinc ferrite employed at 704, and a material such as yttrium-barium-copper oxide employed at 702, the FIG. 7 apparatus may have a typical superconductor material layer thickness of microns and a magnetically susceptible material layer thickness of tens of microns and may have length and depth dimensions of several millimeters and tens of microns, respectively depending on the desired impedance and power carrying capability of the contemplated millimeter wave line, for example.

In addition to the above-mentioned delay line use of the FIG. 7 apparatus, other electrical devices such as an electrical wave filter, an attenuator, a resonator, a microwave energy switching device or circulator may be embodied according to the FIG. 7 apparatus. In a circulator, the cumulative effect of the altered regions 732, 734, 736 and 738 is used to bend the path 707 in order that the input energy at the arrow 706 be diverted to one of a plurality of output ports, this diversion and port selection being thereby controllable by a predetermined pattern arrangement of the mask portions 708–718.

Other uses of the FIG. 7 apparatus include a transmit-/receive switch and a multipath time delay correlator.

Figure 5:
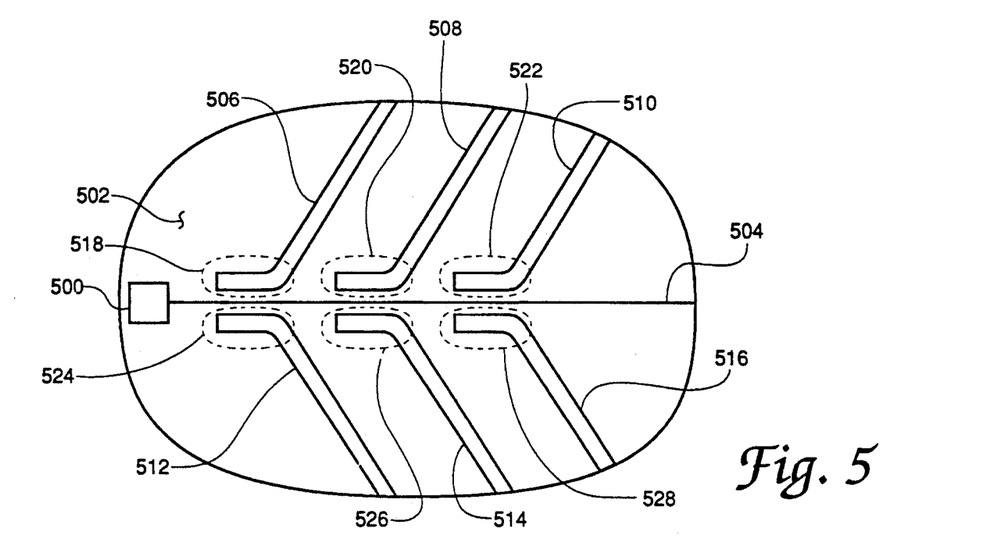
FIG. 5 shows an optical railtap transmitter system employing optical path control in accordance with the present invention.

FIG. 5 in the drawings shows an optical railtap transmitter system according to the invention. In the FIG. 5 apparatus a signal source such as a continuous wave semiconductor laser diode 500 is used to provide optical signals to the optical rail 504. The FIG. 5 system may be fabricated on a wafer of material such as a garnet which exhibits a magneto-optical Faraday effect in the presence of magnetic flux. In the FIG. 5 system the garnet material is indicated at 502 and this material is presumed to overlay a pattern susceptible superconductor material which is not shown in the plan view of the FIG. 5 drawing.

The FIG. 5 optical rail apparatus is concerned with the diversion of optical signal originating in the laser 500 from the rail 504 into one of the railtap paths which are indicated at 506, 508, 510, 512, 514 and 516 in the FIG. 5 drawing. According to the present invention, the control of this diversion is accomplished by way of localized Faraday effect changes in the garnet material 502—as a result of this material incurring magnetic flux from a superconducting pattern area that is disposed below or above the FIG. 5 apparatus in an adjacent planar structure.

Areas wherein this Faraday effect change in the garnet material 502 occurs are shown at 518, 520, 522, 524, 526 and 528 in the FIG. 5 drawing. In each of these areas, which are represented by a dotted line closed pattern, magnetic flux which is remembered or made permanent by way of the superconducting effects described above acts to change the physical properties of the garnet material such that energy flowing along the optical rail 504 is diverted within the region 518, for example, into the tangent railtap path or output path, 506. The index of refraction mechanism by which this diversion of optical energy from the rail 504 to the typical path 506 occurs is known in the art and has been practiced heretofore in railtap systems using, for example, electrical field responsive electro-optical materials in lieu of the magnetic flux responsive magneto-optical material 502. The herein-described use of superconducting originating magnetic flux to control the diversion of optical energy from the rail 504 in the typical region 518 for example adds a new dimension to this phenomenon.

The physical extent of the regions 518, 520, 522, 524, 526 and 528 in the FIG. 5 apparatus is of course shown only representatively in the FIG. 5 drawing. Actual sizes and shapes of these regions in the garnet material will depend upon the nature of a particular embodiment of the invention and on such factors as achievable indexes of refraction in the garnet material and the flux source resolution capability of the superconducting material which causes these regions to exist. In a particular use embodiment of the FIG. 5 apparatus additional or fewer of the output paths 506, 508, 510, 512, 514 and 516 may also be required. The laser diode source 500 in FIG. 5 may of course be replaced with an off-chip source of optical energy which is disposed in communication capability with the optical rail 504. The FIG. 5 apparatus provides the of selectively obtaining a plurality of related signals from a single continuous wave diode laser source and provides capability of controlling the signal admitted to the different output signal lines with locally altered areas of a superconductor magnetic flux controllable optical material.

Figure 6:
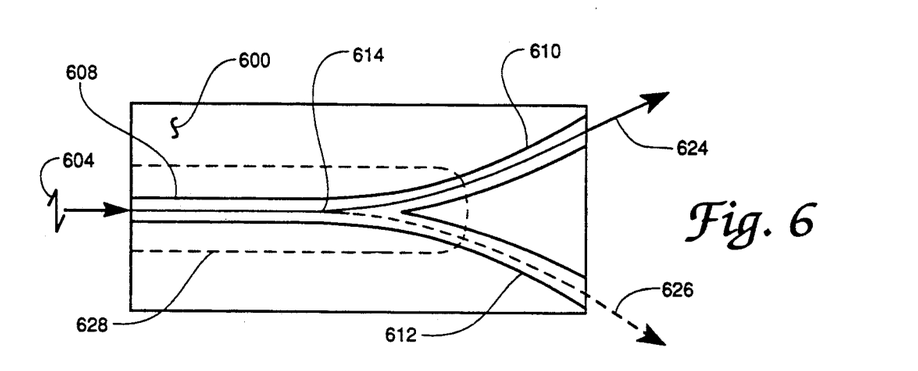
FIG. 6 shows an electromagnetic energy control apparatus which operates in accordance with the superconducting control system of the present invention.

FIG. 6 in the drawings shows an apparatus having some similarity to the FIG. 5 apparatus, but having applicability to either optical energy or radio frequency energy portions of the electromagnetic energy spectrum, depending upon the materials and dimensions employed in its fabrication. The FIG. 6 apparatus represents an essential part of a radio frequency energy circulator, for example, an apparatus wherein an input radio frequency signal as shown at 604 can be directed to one of two possible output paths, as are indicated at 624 and 626. When used as a radio frequency spectrum apparatus the input channel 608 and each of the output channels 610 and 612 are disposed in the substrate material 600 in the form of physical paths having waveguide cross-sectional dimensions which relate to the frequency of the input energy 604 by some fraction of a wavelength as is known in the electrical art.

The present invention related aspects of the FIG. 6 apparatus include the magnetic flux responsive area of the substrate material 600 which is indicated generally at 628. Operation of the FIG. 6 apparatus therefore involves changing the physical properties of the substrate material in the region 628 in order that the input radio frequency energy be diverted by refraction from its quiescent communication along the channel 608-610 and the path 624 to the alternate channel 608-622 and the path 626. A magnetically susceptible dielectric constant material, that is a material whose dielectric constant is a function of an applied magnetic field may therefore be employed for the substrate 600, such materials being exemplified by the ferrite type of materials. The superconductor material may be disposed in the form of a film layer either underlying or overlaying the FIG. 6 represented apparatus or alternately may both underlie and overlay the FIG. 6 apparatus. In each of these options, the Meissner effect retained magnetic flux if present, is coupled with the magnetic flux susceptible region 628 in order to elect one of the output paths 624 and 626.

When embodied as an optical energy processor, the FIG. 6 apparatus can be arranged to accomplish either switching of the input energy 604 between output paths 624 and 626 as in the case of radio frequency energy, or alternately, may be arranged to accomplish polarization rotation of the input energy 604 according to the Faraday effect. The garnet family of materials display a magneto-optic Faraday effect characteristic and therefore perform a vectorial non-reciprocal change in the phase relationship of left and right circularly polarized light in the FIG. 6 apparatus when it is used in the optical portion of the electromagnetic energy spectrum. Such garnet characteristics therefore lend to use of the FIG. 6 apparatus in optical isolators and magneto-optical spatial light modulators and enable use of such apparatus in an arrangement wherein the polarization state of an optical wave is locally changed and a subsequent analyzer achieves power modulation.

Figure 8:
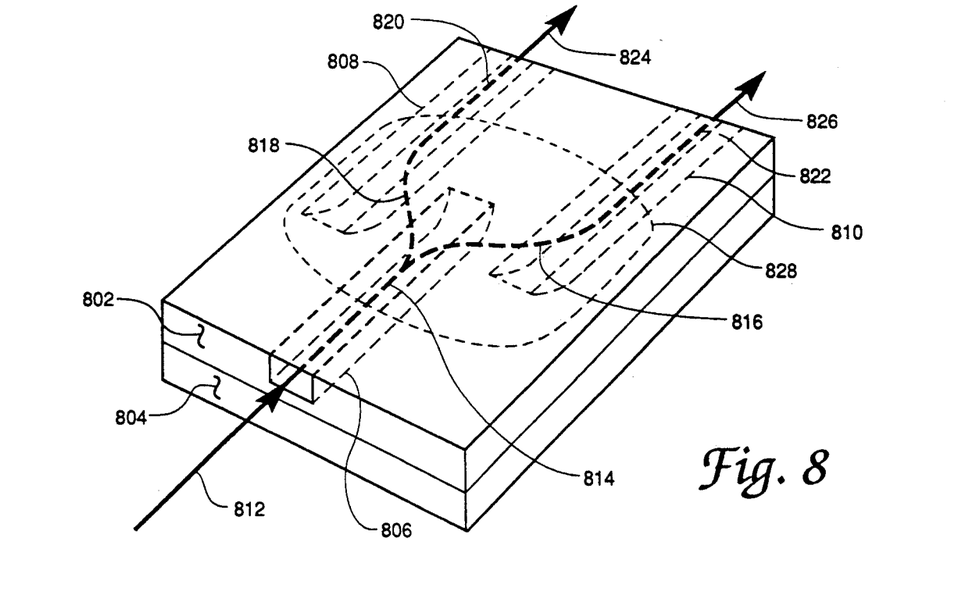
FIG. 8 shows an electromagnetic energy control apparatus according to the invention in a three-dimensional representation.

FIG. 8 in the drawings shows another apparatus arranged according to the present invention. In this FIG. 8 apparatus a pregrooved input channel 806 is provided with electable communication with one of two possible pregrooved output channels 808 and 810 in response to the alteration of energy flow characteristics in a magnetic flux controlled portion 828 of the substrate material 802. The input electromagnetic energy represented at 812 in FIG. 8 communicates along the input path 814 through the pregrooved input channel 806 to the magnetic flux controlled portion of the substrate 828 where diversion along one of the paths 816 and 818 is accomplished according to the presence or absence of superconducting area remembered magnetic flux from the superconductor layer 804 in FIG. 8.

The superconducting pattern existing in the superconductor layer 804 is of course, achieved by way of the above-described optical energy sequence wherein the flux presence portion of the pattern is elevated above the $T_c$ critical temperature in the presence of a magnetic field and subsequently cooled below the $T_c$ temperature.

The electromagnetic energy communicated along the paths 812, 824 and 826 in FIG. 8 is of the optical spectrum range that is subject to control by a garnet material disposed in the substrate 802.

Figure 9:
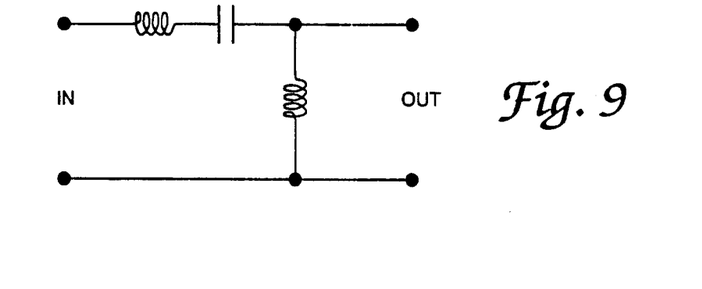
Figure 11:
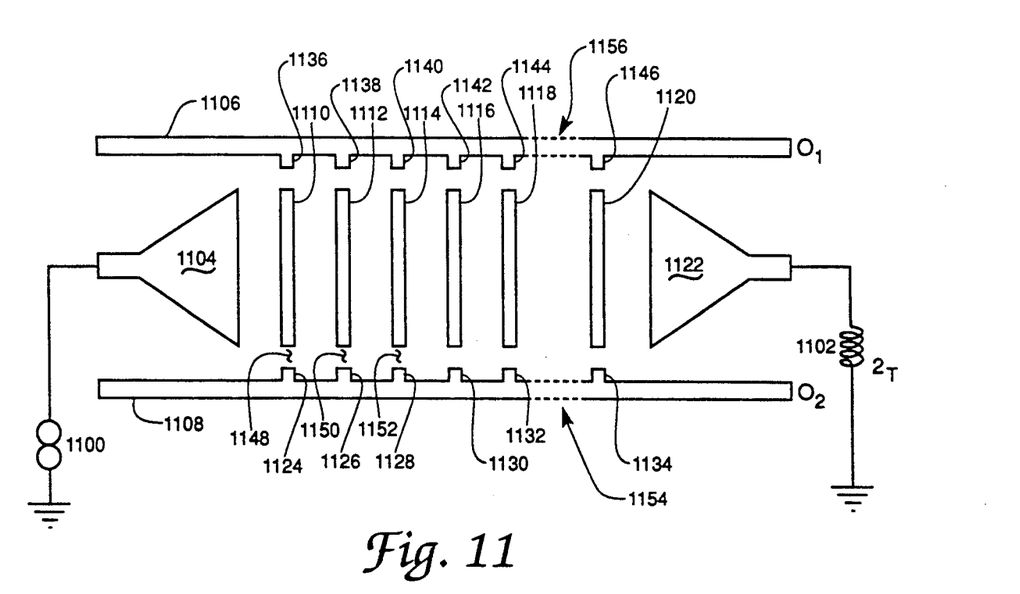

Considering these underlying concepts from a different and more formal perspective, it can be appreciated from FIG. V.18 on page 159 of the R. A. Waldron text identified as reference 16 herein, that the phase shift introduced by a material such as ferrite depends upon the local strength H, of an applied magnetic field. Therefore by changing the strength of the magnetic field captured by the Meissner effect of the present invention the amount of phase shift achieved locally in a ferrite material may be varied. This concept is applied in the FIG. 11 apparatus—an apparatus according to the present invention. In addition the frequency response and impulse response of a transversal filter as discussed commencing at page 6 of the reference 17 text may be considered as follows. If the RLC filter of FIG. 9 in the drawings has an impulse response of $$h(t) = \begin{bmatrix} \alpha e^{-\alpha t} & t \geq \phi \\ 0 & t < \phi \end{bmatrix} \quad (3)$$

then the frequency response of this filter will be $$H(f) = \alpha/(\alpha + j2\pi f) \quad (4)$$

and the filter will provide a magnitude response as a function of frequency of $$H(f) = \alpha/(\alpha^2 + 4\pi^2 f^2)^{\frac{1}{2}} \quad (5)$$

and a frequency related phase response of $$\angle H(f) = \arctan(-2\pi f/\alpha) \quad (6)$$

The shifting theorem for Fourier transforms indicates that a shifting of h(t) by $t_o$ in time results in a phase change of $(-2\pi f t_o)$ but does not change the magnitude $|H(f)|$ of the Fourier waveform.

With such shifting the equation (4) frequency response is modified to become $$H(f) = [\alpha/(\alpha + j2\pi f)]e^{-j2\pi f t_0} \quad (7)$$

and the equation (5) magnitude response H(f) is unchanged. This shift also changes the equation (6) phase response as follows:

$$\angle H(f) = -2\pi f t_o + \arctan(-2\pi f/\alpha) \quad (8)$$

A similar result is achieved for a shift in frequency—as in the case of a bandpass filter centered about $f = f_o$ in lieu of around $f = 0$.

$$H_B(f) = H(f - f_o) + H(f + f_o) \quad (9)$$

$$h_B(t) = h(t)e^{j2\pi f_o t} + h(t)e^{-j2\pi f_o t} \quad (10)$$
$$= 2h(t)\cos 2\pi f_o t \quad (11)$$

This is a classic filter response.

For two cascaded filters the overall frequency response is predicted by the mathematical product of the individual responses $H_1(f)$ and $H_2(f)$ and the overall impulse response h(t) relates to the individual responses $h_1(t)$ and $h_2(t)$ and the overall impulse response h(t) relates to the individual responses $h_1(t)$ and $h_2(t)$ by their convolution product.

$$h(t) = h_1(t) * h_2(t) \quad (12)$$

$$\int_{-\infty}^{+\infty} d\tau h_1(\tau) h_2(t - \tau) \quad (13)$$

The concept of correlation as is defined by these relationships is useful in secure military communications and can be employed with apparatus according to the present invention using the electrical network arrangement shown in FIG. 11 herein.

In addition an artificial dielectric which is isotropic in polarization consists of discrete spherical particles in an otherwise normal dielectric. The metal particles change the propagation velocity of an electric (RF or microwave) wave. In essence they slow down the speed of propagation relative to the normal dielectric. If adjacent lines are used instead of spheres the propagation is anisotropic and polarization sensitive. See pages 56–59 of the reference 18 text. Such polarization sensitive anisotropic propagation is also used in the present invention enabled FIG. 11 network.

Figure 10:
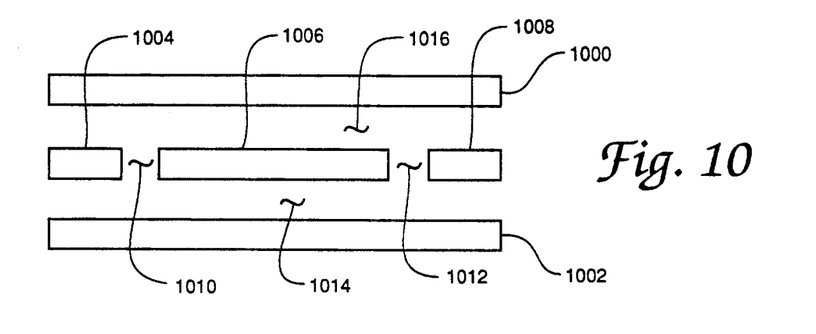

The superconductor apparatus of FIG. 10 in the drawings may be used as a building block in achieving the FIG. 11 network according to the present invention. In the FIG. 10 cross sectional view the elements 1004, 1006, and 1008 comprise superconducting material while the gaps 1010 and 1012 are comprised of non superconducting material as are the spaces 1014 and 1016. The overlaying elements 1000 and 1002 are ground plane members in the FIG. 10 structure. This FIG. 10 structure actually defines a stripline resonator, a resonator, which may be tailored as described below to achieve desirable properties. Additional information regarding the FIG. 10 structure is to be found in reference 19 herein. In this FIG. 10 structure the ground plane members 1000 and 1002 serve as both electrical "ground planes" and as superconductor sources of Meissner effect magnetic flux which influences the characteristics of elements between the ground plane members.

If in fact the FIG. 10 apparatus is configured with the ground plane elements 1000 and 1002 and the center elements 1004, 1006, and 1008 all comprised of superconductor material and with the space 1016 filled with the magnetically responsive ferrite material, as is discussed in connection with reference 16 above, and with the space 1014 filled with the polarization sensitive anisotropic propagation dielectric material described above then a useful electrical network according to the present invention can be achieved.

In such a configuration of the FIG. 10 apparatus the following Table 1 range of dimensions is applicable.

| (FIG. 10 Dimensions Range) | | |
| --- | --- | --- |
| Element # | Maximum Size | Minimum Size |
| 1000 | no upper limit | >1 micrometer |
| 1016 | <1 millimeter | >10 micrometers |
| 1004, 1006, 1008 (thickness) | <1 millimeter | >1 micrometer |
| 1014 | <1 millimeter | >10 micrometers |
| 1002 | no upper limit | >1 micrometer |

The actual dimensions of elements in a particular embodiment of the FIG. 10 apparatus are determined by the frequencies considered, the materials used and the signal amplitudes involved, for example.

FIG. 11 in the drawings shows an electrical network apparatus according to FIG. 10 and Table 1 and the present invention and which is especially useful in military communications (and for other uses as well). The FIG. 10 drawings and the Table 1 dimensions are in fact descriptive of a cross section of the FIG. 11 network apparatus with the elements 1004 and 1008 in FIG. 10 representing the output members numbers $O_2$ and $O_1$, respectively for example.

In the FIG. 11 network apparatus an electrical signal input from a source 1100 is applied to the impedance transforming horn element 1104 and becomes spread out along the elements 1110, 1112 1114, 1116, 1118, 1120 and the terminating element 1122 in the manner of a delay line, especially a delay line of the surface acoustic wave or SAW type. The left to right dimension in FIG. 11 represents several wavelengths of the input wave. The top to bottom dimension of each element 1110–1120 is preferably about one half wavelength of the input signal. The element 1122 in the FIG. 11 apparatus is a delay line terminal of an impedance transforming nature and is connected with a terminating impedance 1102.

In the FIG. 11 network the degree of coupling between the input signal waveform and the output signal collection buses 1106 and 1108 is determined by the geometry of the tooth signal coupling regions i.e. the coupling stubs in such as the typical regions indicated at 1148, 1150, and 1152 in FIG. 11. In these coupling stub regions the nature of the achieved coupling or the weighting factor of each region is determined by the spacing, shape and size of the stub or teeth members and especially by the magnetic flux controlled dielectric properties of the ferrite material which separates the teeth members. These dielectric properties as well as the effective tooth geometry are in the present invention controllable by superconductor element Meissner effect magnetic flux so that the effective configuration of the FIG. 11 network and its effect on the input to output coupled waveforms is determinable by erasable superconductor flux.

In effect by selectively raising a tooth element or a ground plane region in the FIG. 11 network above the superconducting transition temperature (by optical illumination) in the presence of a magnetic field and then allowing the temperature to drop below the transition temperature causes the Meissner effect retention of that magnetic field. Thereby the dielectric properties of the ferrite material in the selected region of the FIG. 11 network are controlled. A change in the dielectric properties between the element 1112 and the tooth 1126, i.e. a change in dielectric properties of the material at 1150 therefore changes coupling between the element 1112 and the tooth 1126 and establishes one weight factor of the FIG. 11 network.

The $O_2$ bus coupling stub teeth 1124, 1126, 1128, 1130, 1132, and 1134 and the similar $O_1$ teeth 1136, 1138, 1140, 1142, 1144, and 1146 actually therefore provide weighted samples of the input signal wave at 1104 on the output buses 1108 and 1106. As indicated at 1154 and 1156 these samples can be of larger number count than indicated in FIG. 11. This sampling of an input waveforms as accomplished in the FIG. 11 network is similar to the effect achieved in filters of the surface acoustic wave type. A network of the FIG. 11 type is in fact useful for a large number of signal processing application usually reserved for surface acoustic wave or SAW devices. A number of such applications are considered in the textbooks of references 17 and 20 herein.

The availability of optical network control and erasability or reconfiguration in a very large class of networks has interesting use possibilities in military and other security related apparatus. During military missions, for example, it is often desirable to have a specialized filter for the transmission and reception of data or other information. By having an optical template which establishes a filter function "of the day" and is not permanent (after the "Meissner effect" filter is written) there is no trace of the filter "function" when cooling is removed from the superconductor and it goes above the critical temperature. Clearly such an erasable "filter" or "code key" has potential uses in strategic aircraft or in message encryption equipment which can fall into enemy hands. Since weight taps and phase are controlled in using the FIG. 11 network and the present invention the spacing between the wire array (artificial dielectric) is not critical. A typical microwave application can have a space of 0.1–5.0 mm between the line array and the coupling stubs. The distance between the line array element may be 0.1–5 mm, the line thickness may be 0.001 to 1 mm, and the length of each line may be 1 cm to 10 cm depending on the frequency of operation and bandwidth. Standard stripline computer aided design models can be applied. The FIG. 11 network can of course be embodied as an optical energy network having smaller dimensions.

While the apparatus of method described constitute a preferred embodiment of the invention, it is to be understood that the invention is not limited to this precise form of apparatus or method and that changes may be made therein without departing from the scope of the invention which is defined in the appended claims.

REFERENCES

Incorporated by Reference Herein

1. I. Bozovic, D. Kirilov, A. Kapitulnik, K. Char, M. R. Hahn, M. R. Beasley, T. H. Geballe, Y. H. Kim, and A. H. Heeger, Phys. Rev. Lett. 59 (2219), 1987.
2. W. R. Donaldson, A. M. Kadin, P. H. Ballentine, and R. Sobolewski, Appl. Phys. Lett., 54 (24), Jul. 12, 1989.
3. H. S. Kwok, J. P. Zheng, and Q. Y. Ying, Appl. Phys. Lett. 54 (24), Jun. 12, 1989.
4. P. B. Corkum, F. Brunel, N. K. Sherman, and T. Srinivasan-Rao, Phys. Rev. Lett. 61 (2886), 1988.
5. S. D. Brorson, J. G. Fujimoto, and E. P. Ippen, Phys. Rev. Lett 59 (1962), 1987.
6. H. S Carslaw, and J. C. Geager, *Conduction of Heat in Solids* (Clarendon, Oxford), 1986.

7. A. Frenkel, M. A. Saifi, T. Venkatesan, C. Lin, X. D. Wu, and A. Inam, Appl. Phys. Lett. 54 (16), Apr. 17, 1989.
8. T. C. Edwards, *Foundation of Microstrip Design* (John Wiley and Sons), 1981.
9. T. Van Duzer, and C. W. Turner, *Principles of Superconductive Devices and Circuits* (Elsevier), 1981.
10. W. H. Chang, J. Appl. Phys. 50 (12), December 1979.
11. S. M. Anlage et al, Appl. Phys. Lett. 54 (26) Jun. 26, 1989.
12. R. S. Withers, A. C. Andersen, P. V. Wright, and S. A. Reible, IEEE Trans. Mag. Mag-19 No. 3, (480–484), May 1983.
13. C. E. Cook, and M. Bernfeld, *Radar Signals* (Academic Press), 1967.
14. R. N. Bates, and R. E. Pearson, Electronic Engineering (39–41), April 1978.
5. G. L. Matthaei, L. Young, E. M. T. Jones, *Microwave Filters, Impedance-Matching Networks, and Coupling Structures* (McGraw-Hill), 1964.
16. R. A. Waldron, *Ferrites, An Introduction for Microwave Engineers,* (D. Von Nostrand Co) 1961.
17. Supriyo Datta, *Surface Acoustic Wave Devices,* (Prentice Hall) 1986.
18. J. D. Kraus, *Electromagnetics,* (McGraw-Hill) 1953
19. D. E. Oates, A. G. Anderson, and B. S. Shih, *Superconducting Stripline Resonators* IEEE MTT-S Digest 1989, pp. 627-630.
20. Colin Campbell, *Surface Acoustic Wave Designs & Their Signal Processing Applications* (Academic Press) 1989.

What is claimed is:

1. Optically controllable superconductor signal processing apparatus comprising the combination of:
   superconductor memory means including a superconductor material first film layer having selectable pattern areas magnetic flux present and remaining pattern areas magnetic flux absent Meissner effect related superconducting memory capability;
   a layer of magnetic flux controllable second material disposed adjacent said superconductor material first film layer, said second layer material having predetermined electromagnetic energy signal flow influencing characteristics susceptible of magnetic flux presence and absence control by magnetic flux from said adjacent first film layer superconducting material;
   superconductor film memory writing means including means for disposing a magnetic field in predetermined writing orientation with respect to said superconductor material first film layer; and
   optical energy generating means for disposing temperature increasing optical energy, determinative of a configuration for said selectable pattern areas, onto a superconducting temperatured surface of said first layer superconductor material, concurrently with said writing means magnetic field, for generating superconductivity-remembered, via superconductivity magnetic flux being present, of said pattern areas in the optically heated and subsequently recooled portions of said superconductor material and superconductivity-remembered, via superconductivity magnetic flux being absent, of said pattern areas in the non optically heated portions of said superconductor material.

2. The apparatus of claim 1 wherein said optical energy generating means includes means for altering, according to said selectable pattern areas, one of a heating effect controlling characteristic of optical intensity, optical spatial orientation, and optical wavelength in said second material layer received optical energy.

3. The apparatus of claim 1 wherein said magnetic flux present and magnetic flux absent pattern areas are complementary with respect to a total surface area of said superconductor material.

4. The apparatus of claim 1 wherein said optical energy generating means includes means for selectively elevating said superconductor material optically heated portions above a superconductivity critical temperature, $T_c$, of said first material.

5. The apparatus of claim 1 wherein said magnetic flux controllable second material is a ferrite material having a magnetic flux responsive dielectric constant.

6. The apparatus of claim 1 wherein said magnetic flux controllable second material is a ferrite material having magnetic field susceptible Faraday effect characteristics in one of microwave and millimeter wave radio frequency spectral ranges.

7. The apparatus of claim 1 wherein said magnetic flux controllable second material is a garnet material having magnetic field susceptible Faraday effect phase changing characteristics with respect to polarized light electromagnetic energy signals.

8. The apparatus of claim 1 wherein said means for disposing a magnetic field and said optical energy generating means are physically segregable with respect to said first and second material film layers.

9. The apparatus of claim 1 wherein said optical energy generating means includes an optical mask member determinative of said flux present and flux absent pattern areas of said superconductor material first film layer.

10. The apparatus of claim 1 wherein said first film layer and said second material layer have physical thicknesses in the range of one micrometer to one millimeter and ten micrometers to four millimeters, respectively.

11. The method for modifying a flow of electromagnetic energy of predetermined radiation wavelength range comprising the steps of:
   communicating said flow of electromagnetic energy, intermediate source and use terminals therefor, to a selectively configured mass of magnetic flux susceptible material having a selectable pattern of electromagnetic energy flow modifying areas disposed therein, with energy flow in said pattern of flow modifying areas being determined by a presently incurred pattern of controlling magnetic flux; and
   disposing into a superconductive material mass located adjacent said magnetic flux susceptible material and magnetically coupled therewith, said pattern of controlling magnetic flux, including predetermined localized flux present and flux absent regions;
   said disposing step including said pattern of flux present and flux absent regions in said superconductive material during a sequence, preliminary to said communicating step, which includes enabling pattern writing magnetic flux penetration into said superconducting material only in flux present areas held above a Meissner effect critical temperature of said superconductive material by pattern determined incident optical energy.

12. The method of claim 11 wherein said electromagnetic energy is radio frequency energy resident in one of microwave and millimeter wave wavelengths.

13. The method of claim 12 wherein said magnetic flux susceptible material is a ferrite material having magnetic field controllable Faraday effect characteristics.

14. The method of claim 13 wherein said method comprises a sequence for switching said radio frequency energy flow between first and second output ports in a radio frequency energy controlling circulator apparatus.

15. The method of claim 11 wherein said modified flow of predetermined wavelength energy is optical energy.

16. The method of claim 15 wherein said magnetic flux susceptible material is a garnet type material having magnetic field controllable Faraday effect characteristics for changing left and right circularly polarized light.

17. The method of claim 16 comprising operation of one of an optical isolator and a magneto-optical spatial light modulator.

18. The method of claim 11 wherein said disposing step further includes cooling said superconducting material below said Meissner effect critical temperature to retain said pattern of flux present and flux absent regions.

19. The method of claim 12 wherein said selectively configured mass of magnetic flux susceptible material and said superconductive material are each of planar configuration.

* * * * *

UNITED STATES PATENT AND TRADEMARK OFFICE
CERTIFICATE OF CORRECTION

PATENT NO. : 5,287,302
DATED : February 15, 1994
INVENTOR(S) : Joseph E. Brandelik et al It is certified that error appears in the above-identified patent and that said Letters Patent is hereby corrected as shown below:

In the Abstract, line 21, change "receive" to --received--.

Column 11, line 63, --capability-- should follow "the".

Column 12, line 36, a comma should follow "flux".

Column 15, line 27, a comma should follow "1112".

Column 17, line 20, "5." should be --15.--.

Signed and Sealed this

Eighteenth Day of April, 1995

Attest:

BRUCE LEHMAN

*Commissioner of Patents and Trademarks*

*Attesting Officer*